United States Patent [19]

Van Peteghem et al.

[11] Patent Number: 4,982,204
[45] Date of Patent: Jan. 1, 1991

[54] METHOD OF ADJUSTING THE LIGHT-EMISSION OF A LIGHT EMITTING DIODE AT A GIVEN DRIVING CURRENT

[75] Inventors: Willy F. Van Peteghem, Borgerhout; Werner E. De Bondt, Temse; Freddy M. Librecht, Boechout; Lucien A. De Schamphelaere, Edegem, all of Belgium

[73] Assignee: AGFA-GEVAERT, N.V., Mortsel, Belgium

[21] Appl. No.: 888,997

[22] Filed: Jul. 24, 1986

[30] Foreign Application Priority Data

Sep. 5, 1985 [EP] European Pat. Off. ........ 85201398.6

[51] Int. Cl.$^5$ ............................................. G01D 15/16
[52] U.S. Cl. ..................................... 346/108; 372/29; 372/31; 372/33; 29/574
[58] Field of Search .................. 346/108, 107 R, 160, 346/76 L, 1.1; 358/296; 29/569 L, 574; 324/158 D; 372/29, 31, 33

[56] References Cited

U.S. PATENT DOCUMENTS

| 4,182,024 | 1/1980 | Cometta | 29/574 |
| 4,489,477 | 12/1984 | Chik | 324/158 D |
| 4,553,148 | 12/1985 | Behrens | 346/107 R |

Primary Examiner—Mark J. Reinhart
Attorney, Agent, or Firm—A. W. Breiner

[57] ABSTRACT

A method is disclosed of adjusting the light-emission of a light-emitting diode to a predetermined output level for a given driving current. The light-emitting diode is irradiated with a laser beam in a manner to burn tiny holes in the light-emitting surface to such an extent that said predetermined output level is obtained. The invention furthermore comprises a method of obtaining a substantially uniform light output of an array of light-emitting diodes.

4 Claims, 3 Drawing Sheets

METHOD OF ADJUSTING THE LIGHT-EMISSION OF A LIGHT EMITTING DIODE AT A GIVEN DRIVING CURRENT

The present invention relates to the adjustment of the light-emission of a light-emitting diode to a predetermined level for a given driving current.

It is known that a multiplicity of LEDs of substantially the same composition in most cases have a different quantum efficiency. This results in a non-equal light output for the LEDs energized by a given driving current. The deviations of the output characteristic of several diodes of substantially the same composition with reference to the theoretical output characteristic of the composed diode configuration are the result of minute variations in the manufacturing of the diodes. Also due to component spreading of the electronic driving circuitry, the output current of the drivers for a given reference input signal can vary.

There are applications wherein even a very small difference in the light output of a multiplicity of equally energized diodes of the same composition is inacceptable.

For example a multiplicity of LEDs can be used in a recording head of a printing device for exposing a photoreceptor. A latent image is formed on a photoreceptor by discharging the photoreceptor image-wise through irradiation by means of the energized LEDs. The latent image is developed by toner particles. Deviations in the output of the LEDs will have an influence on the discharging of the photoreceptor and hence on the development. Adjustment of the light output of the LEDs is important to obtain correct image reproduction.

It is an object of the present invention to provide a method of adjusting the light output of a light-emitting diode to a predetermined level for a given driving current.

A further object is to provide a uniform light output of a multiplicity of energized light-emitting diodes in a LED-array.

The method of the present invention for adjusting the light output of a light-emitting diode to a predetermined output level for a given driving current comprises the steps of irradiating the light-emitting area of said light-emitting diode with a laser beam in a manner to burn tiny holes therein to such an extent that said light output is reduced to said predetermined output level.

The method of the present invention to obtain a substantially uniform light output of a multiplicity of energized light-emitting diodes in a light-emitting diode array comprises the steps of
determining the lowest output level of the energized diodes of said array,
reducing the output level of the diodes emitting an amount of light in excess of said lowest output level by means of laser irradiation in a manner to burn tiny holes into the light emitting area of said diodes to such an extent that said lowest output level is obtained for each diode of said array.

The present invention will become fully understood from a detailed description given hereinbelow and from the accompanying drawings which are given by way of example and are not limitative of the present invention and wherein, FIG. 1 is a diagrammatic view of a printing device incorporating a recording head provided with a multiplicity of LEDs in a LED-array.

Figure 1:
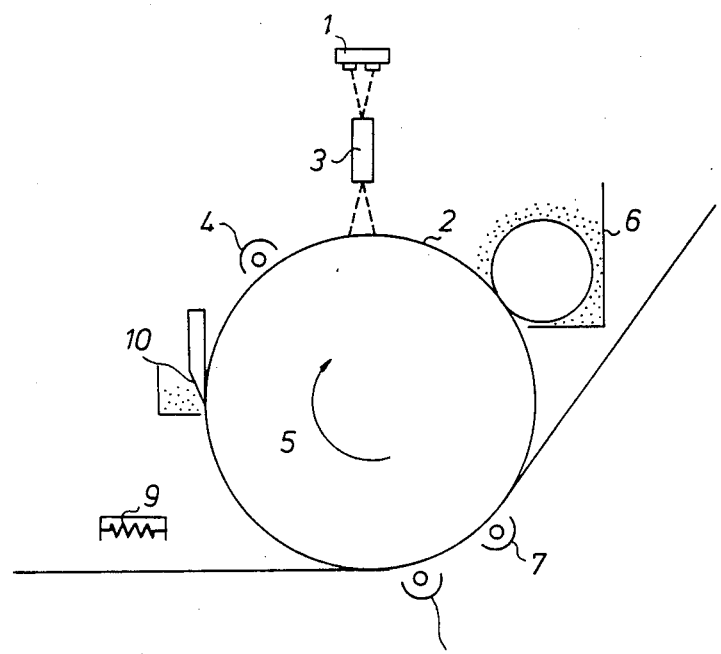
FIG. 1 is a diagrammatic view of a printing device incorporating a recording head provided with a multiplicity of LEDs in a LED array.

The printing device is provided with a recording head (1) that comprises a multiplicity of LEDs arranged in an array extending transversely over the direction of displacement of an information receiver, e.g. a photoreceptor (2). In this embodiment, the photoreceptor is provided in a drumlike form and the irradiation by the recording head is focused on the photoreceptor by optical transfer means (3). The LEDs are individually energizable for information-wise exposing the photoreceptor in response to the received information signals. The recording head in addition to the number of light-emitting diodes comprises an equal number of driver circuits for energizing each of the light-emitting diodes in response to the data bit signals. Additional information concerning the LED array and associated driving and addressing circuitry can be found in the European patent application EU No. 0 142 579 A1.

A corona discharge station (4) electrically charges the surface of the drum while it is rotating in the sense of the arrow (5). The drum passes past the recording head and the areas that are exposed to irradiation by elements of the recording head become discharged, whereas the unexposed areas maintain their charge. The latent image thus produced is developed by developing station (6) wherein a toner developer is brought into contact with the drum.

The toner pattern is transferred onto a paper sheet in transfer station (7), the paper sheet is separated from the drum in corona separator station (8) and finally the image is fused in fuser station (9). A cleaner station (10) removes the toner still remaining on the drum surface before a next exposure is made.

In the described printing device continuous tone information is reproduced through image-screening. The information in each pixel is expressed by means of a binary value in accordance with which the LED drivers can be activated to generate the driving current for the associated LED.

Irradiation of the photoreceptor by means of an energized LED discharges the photoreceptor locally. On the drum's surface a latent image is formed that is developed by means of toner particles and subsequently transferred onto paper and fixed.

Deviations in the light output of the different LEDs may result in a latent image on the photoreceptor that is not a correct reproduction of the information that was applied to the LEDs in the form of a binary signal.

Figure 2:
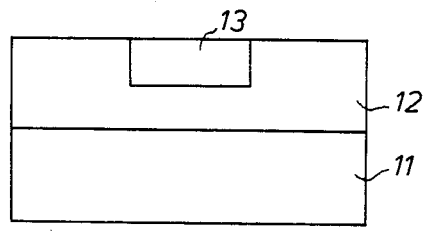
FIG. 2 shows the basic configuration of one LED part of the LED-array that is comprised in the recording head.

FIG. 2 shows the basic configuration of one LED part of the LED-array that is comprised in the recording head of FIG. 1. The array of LEDs is formed by aligned modules composed of rows of LEDs that are made on a common monolithic substrate. Each LED is composed of a GaAs-substrate layer (11) whereon a GaAsP layer (12) is grown. In order to form the diode p-n junction Zn++-ions (13) are locally diffused into said GaAsP upper layer.

Figure 3:
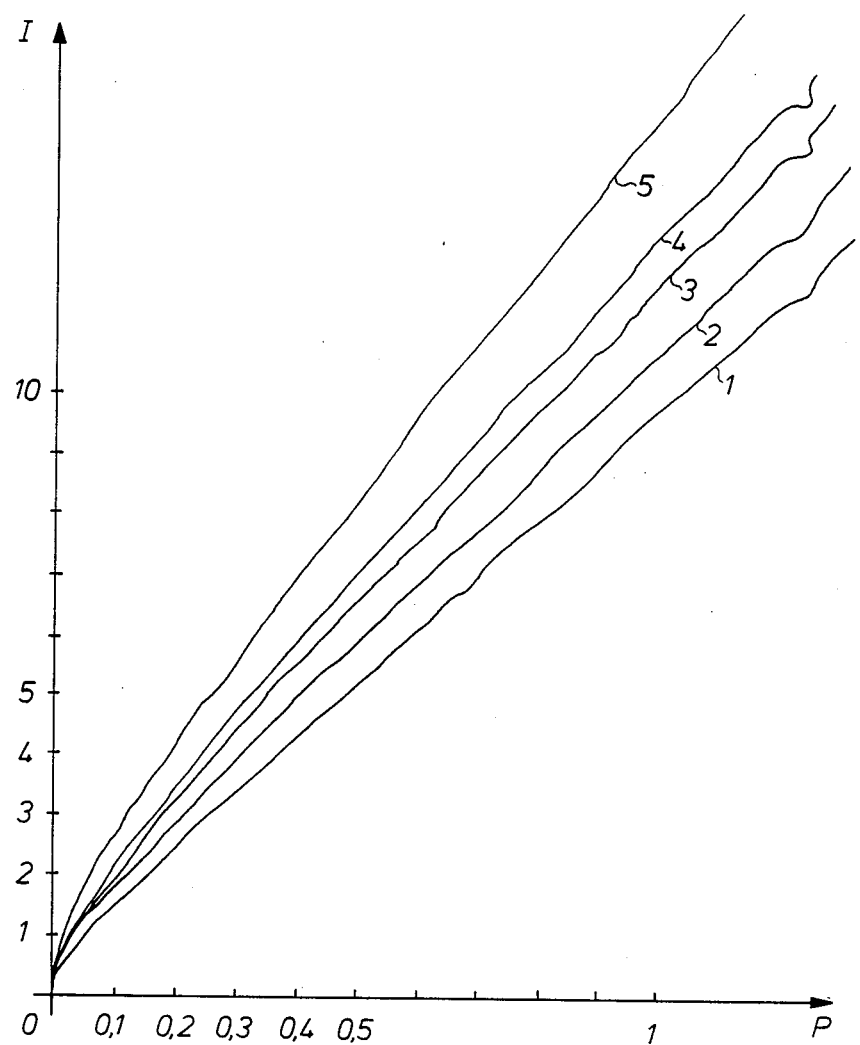
FIG. 3 illustrates the light output versus drive current characteristic of the LED structure of FIG. 2 with 0, 2, 3, 4, 5 laser burned holes.

FIG. 3 illustrates the light output P (microW/sr) versus the driving current I (mA) of an LED structure.

Curve 1 illustrates the light output versus the driving current of an LED structure as is shown in FIG. 2.

Curves 2, 3, 4 and 5 illustrate the light output versus the driving current of the same LED structure wherein 2, 3, 4, and 5 holes respectively are burned.

The holes have been formed by irradiation of the light-emitting surface of the LED with an argon laser emitting electromagnetic radiation at a wavelength of 488 nanometer.

So as to form tiny holes in the light-emitting area, said area and the laser are transported relative to each other in a direction perpendicular to the plane of said light-emitting area. Appropriate light-focussing means are provided to focus the laser light onto said light-emitting area. The tiny holes have an average diameter of 1 micrometer.

As can be concluded from the results given in FIG. 3, the light output of the LED for a given driving current decreases as the number of holes burned into the light-emitting area of the diode increases.

As an alternative the light output of a LED can be decreased by increasing of the laser energy used so as to burn a larger hole.

This figure illustrates that the light output of an energized light-emitting diode can be reduced to a given level by burning an appropriate number of holes into its light-emitting surface.

Therefore it is possible to obtain a uniform output of an array of LEDs by reducing the output of the LEDs to the lowest output level in said array. This reduction is obtained by burning an appropriate number of holes into the diodes having an output in excess of said lowest level.

Figure 4:
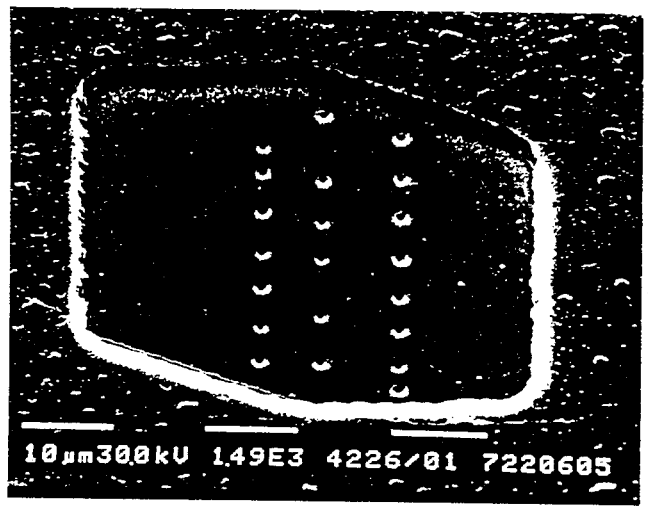
FIG. 4 is a photograph of a light-emitting window wherein several spots are formed by means of a laser beam.

FIG. 4 is a photograph of the light-emitting area of a LED wherein several holes are burned through irradiation by means of a laser beam.

Figure 4A:
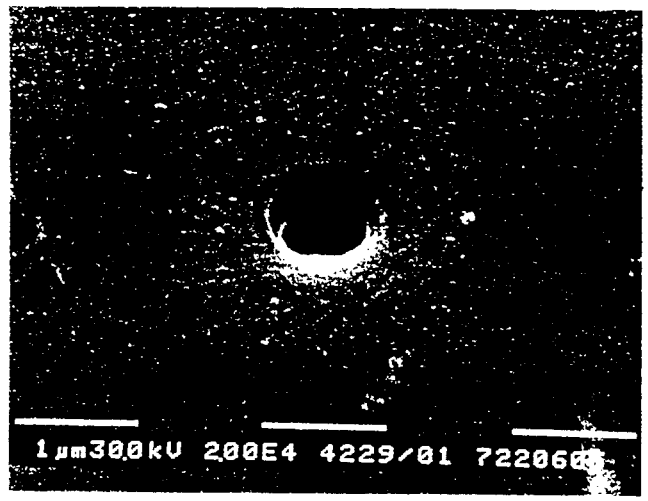
FIG. 4a is an enlarged view of one single spot.

As can be seen on FIG. 4(a) representing one of the spots, the spot diameter is approximately 1 micrometer.

We claim:

1. Method of adjusting the light output of a light-emitting diode to a predetermined output level for a given driving current characterised in that the light-emitting area of said light-emitting diode is irradiated with a laser beam to such an extent that said light output is reduced to said predetermined output level.

2. Method of providing a substantially uniform light output of a multiplicity of energized light-emitting diodes in a light-emitting diode array comprising the steps of determining the lowest output level of the energized diodes of said array, reducing the output level of the diodes emitting an amount of light in excess of said lowest output level by laser irradiation of the light emitting area of said diodes, to such an extent that said lowest output level is obtained for each diode of said array.

3. A light-emitting diode array comprising a multiplicity of light-emitting diodes characterised in that there are one or more holes burnt in the light-emitting area of one or more of said diodes.

4. A printing device incorporating a recording head comprising a light-emitting diode array according to claim 3.

* * * * *